(12) United States Patent
Eun

(10) Patent No.: US 10,569,582 B2
(45) Date of Patent: Feb. 25, 2020

(54) PAPER JAM SENSING AND RECOVERY METHOD FOR RECEIPT PRINTER

(71) Applicant: POSBANK CO., LTD, Seoul (KR)

(72) Inventor: Dong Uk Eun, Gwangmyeong (KR)

(73) Assignee: POSBANK CO., LTD, Seoul (KR)

( * ) Notice: Subject to any disclaimer, the term of this patent is extended or adjusted under 35 U.S.C. 154(b) by 0 days.

(21) Appl. No.: 16/083,735

(22) PCT Filed: Mar. 23, 2017

(86) PCT No.: PCT/KR2017/003108
§ 371 (c)(1),
(2) Date: Sep. 10, 2018

(87) PCT Pub. No.: WO2017/164660
PCT Pub. Date: Sep. 28, 2017

(65) Prior Publication Data
US 2019/0070876 A1 Mar. 7, 2019

(30) Foreign Application Priority Data
Mar. 25, 2016 (KR) .................. 10-2016-0035982

(51) Int. Cl.
| | |
|---|---|
| *B41J 29/38* | (2006.01) |
| *G07G 5/00* | (2006.01) |
| *B41J 11/70* | (2006.01) |
| *B41J 15/04* | (2006.01) |
| *B41J 11/00* | (2006.01) |

(Continued)

(52) U.S. Cl.
CPC ............ *B41J 29/38* (2013.01); *B41J 11/006* (2013.01); *B41J 11/0095* (2013.01); *B41J 11/70* (2013.01); *B41J 13/0009* (2013.01); *B41J 15/042* (2013.01); *G01R 19/16528* (2013.01); *G07G 5/00* (2013.01); *B26D 2007/005* (2013.01); *B41J 11/66* (2013.01); *G06K 15/4085* (2013.01)

(58) Field of Classification Search
CPC ...... B41J 29/38; B41J 13/0009; B41J 11/006; B41J 11/0095; B41J 11/66; B41J 13/00; B41J 15/00; B41J 15/04; B41J 15/044; B41J 15/046; G07G 5/00
See application file for complete search history.

(56) References Cited

U.S. PATENT DOCUMENTS

2015/0202895 A1 7/2015 Nihashi et al.

FOREIGN PATENT DOCUMENTS

| JP | H01127297 U | 8/1989 |
|---|---|---|
| JP | H03223058 A | 10/1991 |

(Continued)

OTHER PUBLICATIONS

Extended European Search Report issued in European Patent Application No. 17770630.6 dated Oct. 10, 2019.

*Primary Examiner* — Kristal Feggins
(74) *Attorney, Agent, or Firm* — Patentfile, LLC; Bradley C. Fach; Steven R. Kick

(57) ABSTRACT

The present invention relates to a paper jam sensing and recovery method for a receipt printer, the method enabling accurate measuring and determining of a motor overload state, which is most problematic when jam occurs, and enabling an immediate response if an overcurrent is generated on the basis of a driving current, such that damage to the motor or a driving circuit is fundamentally prevented and, also, paper jam occurring in a peripheral part of a printer cutter can be prevented in advance, thereby blocking product damage.

3 Claims, 3 Drawing Sheets

(51) Int. Cl.
*B41J 13/00* (2006.01)
*G01R 19/165* (2006.01)
*B26D 7/00* (2006.01)
*B41J 11/66* (2006.01)
*G06K 15/00* (2006.01)

(56) References Cited

FOREIGN PATENT DOCUMENTS

| | | |
|---|---|---|
| JP | H1110971 A | 1/1999 |
| JP | 2001063166 | 3/2001 |
| JP | 2001088348 A | 4/2001 |
| JP | 2005007592 A | 1/2005 |
| JP | 2005022204 A | 1/2005 |
| JP | 2007156358 A | 6/2007 |
| JP | 2013071227 A | 4/2013 |
| KR | 100120584 | 2/1996 |

PAPER JAM SENSING AND RECOVERY METHOD FOR RECEIPT PRINTER

This Application is a 35 U.S.C. 371 National Stage Entry of International Application No. PCT/KR2017/003108 filed on Mar. 23, 2017, which claims the benefit of Republic of Korea Patent Application No. 10-2016-0035982, filed on Mar. 25, 2016, the entire disclosures of which are incorporated by reference herein.

TECHNICAL FIELD

The present invention relates to method of detecting and recovering a paper jam of a receipt printer that outputs a receipt according to an output control signal of a main system 10, the method including: operation (S1) of performing a printer output command in a printer control unit 100 according to an output command S0 of the main system 10; operation (S2) of detecting a drive current applied to a cutter driving motor 150 through a current sensing unit 140 and then, determining a jam occurrence situation if a predetermined current value is exceeded; operation (S4) of transmitting a jam occurrence situation signal to the main system 10 when it is determined as the jam occurrence situation; checking whether or not the jam occurrence situation is restored (S5), and performing operation (S5a) of transmitting a jam occurrence situation restoration completion signal to the main system 10 if it is confirmed that the jam occurrence situation is restored; if the main system 10 receives the jam occurrence situation signal, waiting until the jam occurrence situation recovery completion signal is received (S6), and if the jam occurrence situation recovery completion signal is received, operation (S6) of performing operation (S1) of performing the printer output command in the printer control unit 100 again; and if the output is completed according to the printer output command (S3), operation (S3a) of outputting a normal output completion signal to the main system 10.

BACKGROUND ART

In general, a cash register is a device for processing various data involved in selling a product and informing the user of the result so as to be used to smooth information management. Such a cash register widely ranges from one being able to handle only simple sales to a Point of Sales (POS) system that can manage the distribution economy such as market research and inventory survey. Hereinafter, the term electronic cash register controlled by a microprocessor is used as a broad concept including a low-cost cash register to a POS terminal.

A point of sale (POS) terminal as a kind of electronic cash register is a device used to facilitate management of information on sales by informing sellers of various data accompanying sales of the products at the seller of the products, and POS terminals equipped with functions to manage the distribution economy such as market research and inventory survey have been developed and partially used.

Generally, the POS terminal includes a data input means for inputting data, a central processing unit for processing the input data and processing various information on sales, a memory for storing information necessary for data processing, and a data output means for outputting various data. The data input unit may include a key input unit for inputting data, a barcode reader, an optical scanner reader, a credit card inquiry device, and so on, and the data output means may include a printer device for outputting various processing results as a document and a display device for displaying various processing results as images.

Meanwhile, when products are sold, in order to print various details such as price, quantity, total amount, payment amount and balance on a receipt and issue it, these ECRs include a receipt printer and an automatic cutter that automatically cuts out the printed receipt before it is issued.

These automatic cutters consist of a blade for cutting the receipt and a drive motor for moving the blade, and if jam occurs, for example, after the sales data is printed on the receipt, the blade of the automatic cutter is driven, causing a paper jam at the moment of cutting the receipt or foreign matter is caught inside the automatic cutter and the blade driving motor inside the automatic cutter is not smoothly driven, there is a problem that the motor and the motor driving circuit components are continuously defective due to the overload being continuously applied to the motor.

To solve this problem, in the prior art, as disclosed in Korean Patent Laid-Open Publication No. 10-1999-038936 entitled "Automatic Cutter Drive Control Method of Cash Register", a driving time of the blade is counted, and if the driving time of the blade is longer than a predetermined reference time, a configuration for determining that an error has occurred is proposed.

However, since this conventional invention merely compares the driving time of the blade with a predetermined reference time, when the driving time of the blade exceeds a predetermined reference time, there is a problem in that it can not accurately determine whether or not a load is actually generated in a motor or the like, and only processes it by occurrence of an error. In addition, when a load is generated in the motor and an overcurrent flows, since the overcurrent continues to flow until the predetermined reference time elapses, there is a problem that the motor or the drive circuit is damaged. In particular, in the case of a driving circuit, since the semiconductor device is mostly composed of a semiconductor device, there is a possibility that the device may be damaged or broken even in an instant overcurrent.

In addition, when the occurrence of the jam phenomenon is solved, since there is no separate processing procedure, there is a problem that it is difficult to automatically return to the normal operation state again.

DISCLOSURE

Technical Problem

The present invention provides a method of detecting and recovering paper jam of receipt printers, through which since it is possible to accurately measure and determine the overload state of the motor which is the most problematic in the occurrence of the jam phenomenon, and it is possible to instantly respond to the occurrence of the overcurrent based on the drive current, there is an advantage that it is possible to prevent damage to the motor or the drive circuit and to prevent the paper jam phenomenon occurring at the periphery of the printer cutter, thereby preventing damage to the product.

Also, the present invention provides a method of detecting and recovering paper jam of receipt printers, through which when it is determined that a jam occurs, in case of a jam due to a cause such as a simple temporary paper jam by performing reverse driving, it is possible to solve the instantaneous jam phenomenon immediately.

On the other hand, the present invention provides a method of detecting and recovering paper jam of receipt printers, through which when the jam phenomenon is solved, this is transmitted to the main system, and normal operation can be continued.

Technical Solution

According to another aspect of the present invention, there is provided a method of detecting and recovering a paper jam of a receipt printer that outputs a receipt according to an output control signal of a main system 10, the method including: operation (S1) of performing a printer output command in a printer control unit 100 according to an output command S0 of the main system 10; operation (S2) of detecting a drive current applied to a cutter driving motor 150 through a current sensing unit 140 and then, determining a jam occurrence situation if a predetermined current value is exceeded; operation (S4) of transmitting a jam occurrence situation signal to the main system 10 when it is determined as the jam occurrence situation; checking whether or not the jam occurrence situation is restored (S5), and performing operation (S5a) of transmitting a jam occurrence situation restoration completion signal to the main system 10 if it is confirmed that the jam occurrence situation is restored; if the main system 10 receives the jam occurrence situation signal, waiting until the jam occurrence situation recovery completion signal is received (S6), and if the jam occurrence situation recovery completion signal is received, operation (S6) of performing operation (S1) of performing the printer output command in the printer control unit 100 again; and if the output is completed according to the printer output command (S3), operation (S3a) of outputting a normal output completion signal to the main system 10.

Additionally, operation (S2) of determining the jam occurrence situation may further include: operation (S2b) of starting to drive the cutter driving motor 150 in a forward direction when recognizing the output command (S2a); detecting a driving current applied to the cutter driving motor 150 through the current sensing unit 140, and then determining whether the driving current exceeds a preset reference current value (S2c); if the drive current is determined to exceed the reference current value, operating a brake on the drive of the cutter driving motor 150 (S2d), and then operation (S2e) of driving the cutter driving motor 150 in a reverse direction until the cutter position sensor 160 senses a current return; and operation of (S2f) of transmitting a jam occurrence situation signal.

Additionally, the reference current value may be set to a value within a range of 0.5 to 0.7 times a stall current value of the cutter driving motor 150.

Additionally, the reference current value may be set to a value within a range of 0.5 to 0.7 times the maximum driving current value of the motor driving unit 130.

Additionally, the checking whether or not the jam occurrence situation is restored (S5) may be performed through at least one of continuously detecting opening and closing of a printer paper cover and checking whether a printer paper is abnormal through a printer paper detection sensor.

Advantageous Effects

According to the present invention, since it is possible to accurately measure and determine the overload state of the motor which is the most problematic in the occurrence of the jam phenomenon, and it is possible to instantly respond to the occurrence of the overcurrent based on the drive current, there is an advantage that it is possible to prevent damage to the motor or the drive circuit and to prevent the paper jam phenomenon occurring at the periphery of the printer cutter, thereby preventing damage to the product.

Also, when it is determined that a jam occurs, in case of a jam due to a cause such as a simple temporary paper jam by performing reverse driving, it is possible to solve the instantaneous jam phenomenon immediately.

On the other hand, it is advantageous that when the jam phenomenon is solved, this is transmitted to the main system, and normal operation can be continued.

BEST MODE FOR CARRYING OUT THE INVENTION

Figure 1:
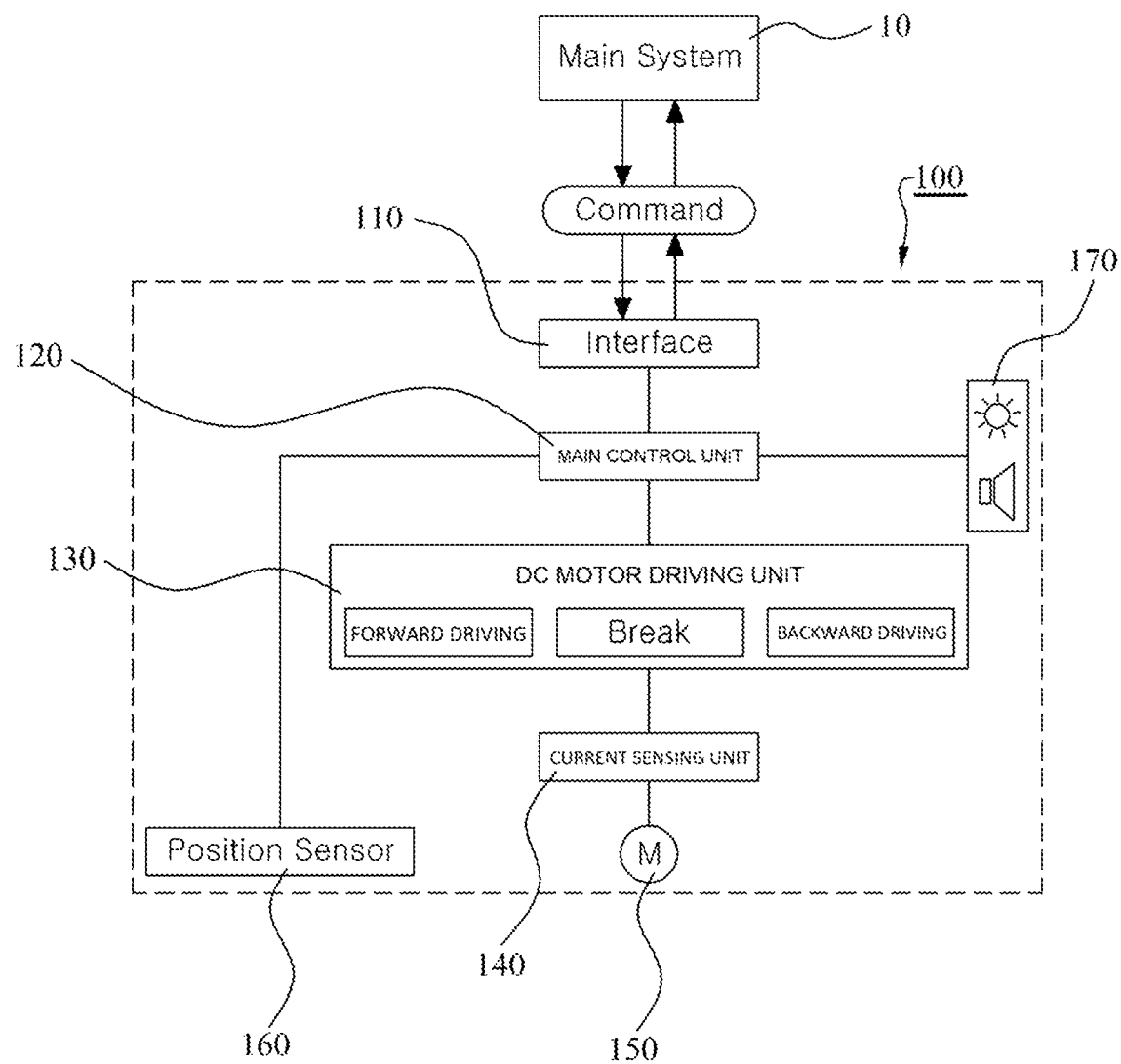
FIG. 1 is a schematic block diagram of a receipt system in which a method of detecting and recovering paper jam of a receipt printer is used according to an embodiment of the present invention.
Figure 2:
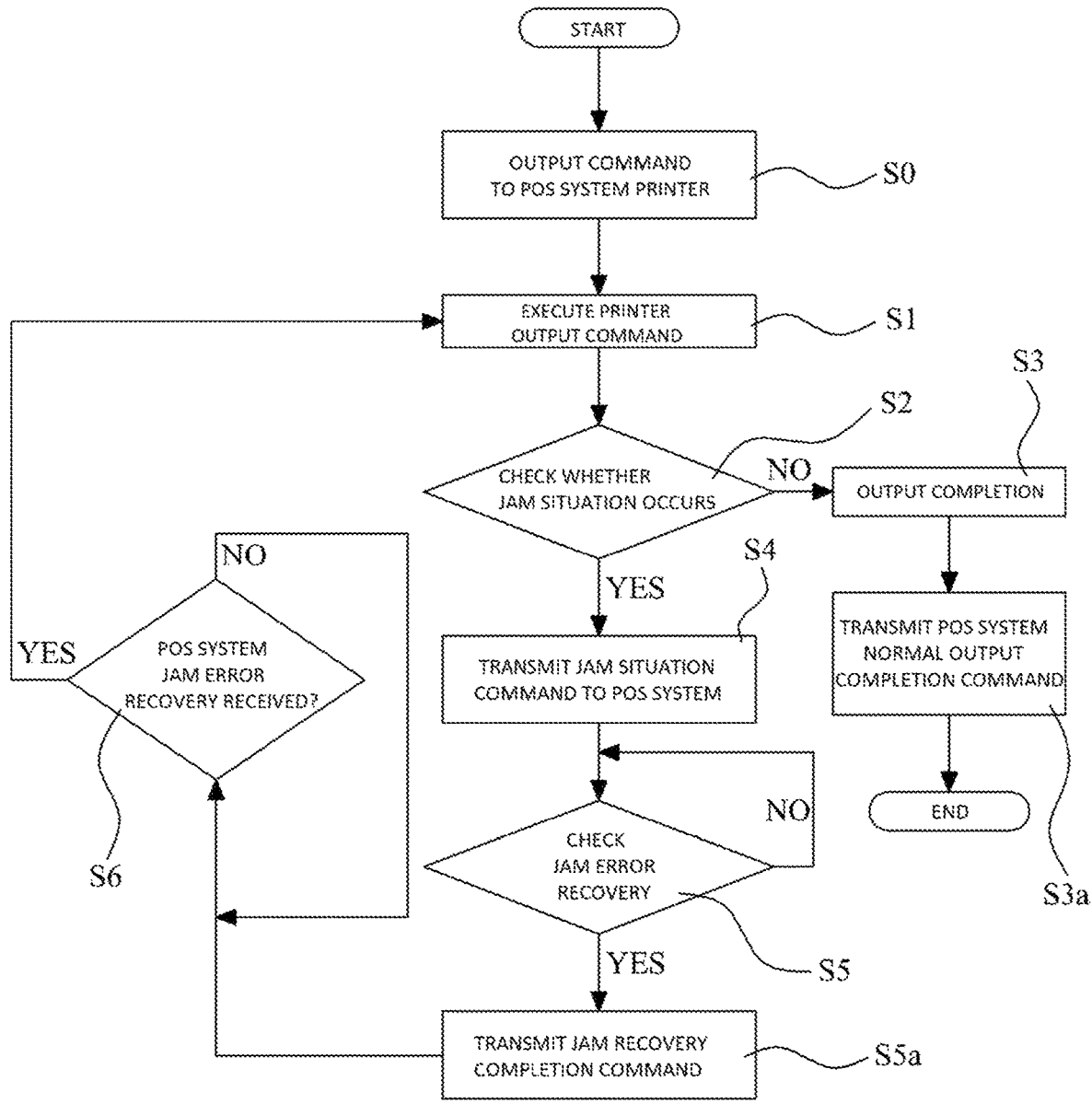
FIG. 2 is a flowchart of a method of detecting and recovering a paper jam of a receipt printer according to an embodiment of the present invention.

Hereinafter, with reference to the accompanying drawings, a method of detecting and recovering paper jam of a receipt printer according to an embodiment of the present invention will be described in detail. First, in the drawings, it should be aware that the same components or parts are denoted by the same reference numerals whenever possible. In describing the present invention, a detailed description of related known functions and configurations will be omitted so as not to obscure the subject matter of the present invention.

First, a configuration of a receipt printer in which a method of detecting and recovering paper jam of a receipt printer according to an embodiment of the present invention is performed will be described. As shown in FIG. 1, the receipt printer may be connected to a main system 10 including any of a variety of equipment requiring a receipt output such as a point of sale (POS) terminal or may be included as part. The receipt printer includes a printer control unit 100 as shown in FIG. 1.

As shown in FIG. 1, the printer control unit 100 includes an interface 110 for exchanging signals with the main system 10, a main control unit 120 connected to the interface 110 to control operation thereof, a motor driving unit 130 for driving the cutter driving motor 150 in a forward/brake/reverse direction under the control of the main control unit 110, a current sensing unit 140 for measuring a current applied to the cutter driving motor 150 from the motor driving unit 130 and transmitting the result to the main control unit 110, and a cutter position sensor 160 for detecting the position of the cutter. Meanwhile, as shown in FIG. 1, the printer control unit 100 may further include an alarm generation unit 170 for informing a user of whether a malfunction occurs through a visual or audible signal.

Hereinafter, a method of detecting and recovering a paper jam of a receipt printer according to an embodiment of the present invention will be described.

In a method of detecting and recovering a paper jam of a receipt printer that outputs a receipt according to an output control signal of a main system, as shown in FIG. 1, a method of detecting and recovering a paper jam of a receipt printer according to the present invention first performs an operation (S1) of performing a printer output command in the printer control unit 100 according to the output command S0 of the main system 10.

Next, the method detects a driving current applied to the cutter driving motor 150 through the current sensing unit 140, and then performs operation (S2) of determining a jam occurrence state if the predetermined current value is exceeded.

In this case, if it is determined that the jam occurrence condition is detected, the method performs operation (S4) of transmitting a jam occurrence situation signal to the main system 10 so that the main system 10 recognizes the jam occurrence situation and the operation is stopped and waited until the jam occurrence situation is resolved.

Next, the method checks whether the jam occurrence situation is restored (S5), and performs operation (S5a) of transmitting a jam occurrence situation restoration completion signal to the main system 10 if it is confirmed that the jam occurrence situation is recovered. When receiving the jam occurrence situation signal, the main system 10 waits (S6) until it receives the jam occurrence situation restoration completion signal, and when receiving the jam occurrence situation recovery completion signal, the main system 10 performs operation (S6) of re-performing operation (S1) of performing the printer output command in the printer control unit 100. On the other hand, if the jam occurrence situation recovery completion signal is not received until the predetermined waiting time elapses in operation (S6) of waiting for receiving the jam occurrence situation restoration completion signal, as transmitting an A/S request signal to the main system 10, it is desirable that the main system 10, which is normally connected to a communication network such as the Internet network, automatically notifies the A/S acceptance server of the management company of the occurrence of a failure and accepts the failure occurrence. In this case, it is desirable that the A/S acceptance server recognizes the position of the main system 10 using an identification ID, a communication network connection location, and so on and then, notifies the A/S provider (e.g., repair/management agents) within the closest distance of the location of the main system 10 and the occurrence of the failure.

Thereafter, when the output is completed according to the printer output command (S3), operation (S3a) of transmitting a normal output completion signal to the main system 10 is performed.

Through these operating stages, in relation to jam occurrence due to various factors such as paper jam, since it is possible to perform the recovery operation by detecting the damage of the motor driving unit 130 or the cutter driving motor 150 due to overload, it is possible to immediately respond to the occurrence of an overcurrent based on the drive current in addition that overload state can be accurately measured and determined, so that it is possible to prevent the paper jam phenomenon occurring in the periphery of the printer cutter from occurring in addition that the damage to the motor driving unit 130 or the cutter driving motor 150 is originally blocked, thereby preventing damage to the product.

On the other hand, if it is determined that the jam occurrence state is present, it is desirable to further perform the operation of notifying the user of the occurrence of jam through the alarm generation means 170. In this case, the alarm generation means 170 may be implemented through various embodiments, and one embodiment may include at least one of a visual warning such as a warning light, a warning image, and a warning character display, as well as an audible warning such as a warning sound and a warning sound output, and may be implemented.

The operation (S2) of determining the jam occurrence state will be described in more detail with reference to FIG. 3.

Figure 3:
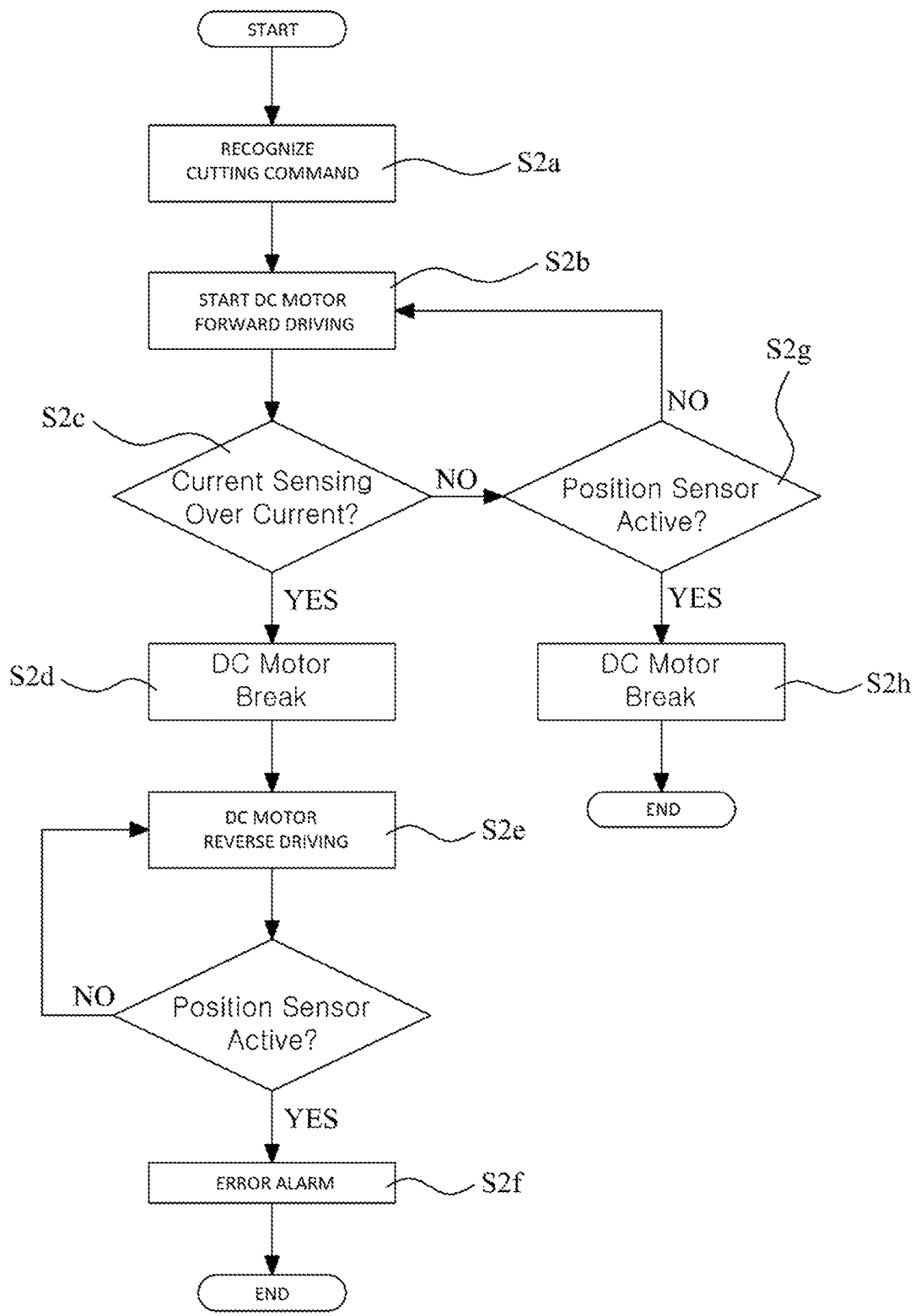
FIG. 3 is a more detailed flowchart of a method of detecting and recovering a paper jam of a receipt printer according to an embodiment of the present invention.

As shown in FIG. 3, operation (S2) of determining the occurrence of the jam performs operation (S2b) of starting the driving of the cutter driving motor 150 in the normal direction once recognizing the output command (S2a).

Thereafter, after the driving current applied to the cutter driving motor 150 is sensed through the current sensing unit 140, operation (S2c) of determining whether the reference current value exceeds a preset reference current value is performed. If it is determined that the driving current exceeds the reference current value, after the brake is operated on the drive of the cutter driving motor 150 (S2d), until the cutter position sensor 160 detects the cutter return, operation (S2e) of driving the cutter driving motor 150 in the reverse direction, and operation (S2f) of transmitting a jam occurrence situation signal are further performed. Also, when it is determined that a jam occurs, in case of jam due to a cause such as a simple temporary paper jam, it is possible to solve the instantaneous jam phenomenon immediately by performing reverse driving.

In this case, in simultaneous consideration that the reference current value prevents a situation where an overload is applied as stall phenomenon of the cutter driving motor 150 occurs and in the case of a conventional DC motor, the rated operating current value having the maximum efficiency is in the range of 0.2 to 0.4 times the stall current value, it is preferably set to a value within a range of 0.5 to 0.7 times the stall current value of the cutter driving motor 150.

Meanwhile, for receipt printers, the motor driving unit 130 is usually composed of an H-bridge using a semiconductor power device such as a diode or a FET or a driving circuit corresponding thereto in a small scale, and they are integrated in one driving chip in general and have a predetermined continuous operation allowable current value and a maximum drive current value in a predetermined standard. Therefore, in order to prevent the motor driving unit 130 from being damaged by an overcurrent, the reference current value is preferably set to a value within a range of 0.5 to 0.7 times the maximum driving current value of the motor driving unit 130.

Next, an operation of confirming whether the jam occurrence situation is restored (S5) will be described. The operation of confirming whether the jam occurrence situation is restored (S5) can be implemented in various embodiments. In one embodiment, the determining whether the jam occurrence situation is restored (S5) is performed through at least one of that the user continuously detects and performs opening and closing of the printer paper cover to process paper jam and that the user checks whether the printer paper is abnormal through the printer paper detection sensor, in order to solve the jam occurrence situation.

In the above, optimal embodiments have been disclosed in the drawings and specification. Although specific terms have been used herein, they are used for purposes of illustration only and are not intended to limit the scope of the invention as defined in the claims or the claims. Therefore, those skilled in the art will understand that various modifications and equivalent embodiments are possible without departing from the scope of the present invention. Accordingly, the true scope of the present invention should be determined by the technical idea of the appended claims.

The invention claimed is:

1. A method of detecting and recovering a paper jam of a receipt printer that outputs a receipt according to an output control signal of a main system (10), the method comprising:

operation (S1) of performing a printer output command in a printer control unit (100) according to an output command (S0) of the main system (10);

operation (S2) of detecting a drive current applied to a cutter driving motor (150) through a current sensing unit (140) and then, determining a jam occurrence situation if a predetermined current value is exceeded;

operation (S4) of transmitting a jam occurrence situation signal to the main system (10) when it is determined as the jam occurrence situation;

checking whether or not the jam occurrence situation is restored (S5), and performing operation (S5*a*) of transmitting a jam occurrence situation restoration completion signal to the main system (10) if it is confirmed that the jam occurrence situation is restored;

if the main system (10) receives the jam occurrence situation signal, waiting until the jam occurrence situation recovery completion signal is received (S6), and if the jam occurrence situation recovery completion signal is received, operation (S6) of performing operation (S1) of performing the printer output command in the printer control unit (100) again;

if the output is completed according to the printer output command (S3), operation (S3*a*) of outputting a normal output completion signal to the main system (10);

wherein a reference current value is set to a value within a range of 0.5 to 0.7 times a stall current value of the cutter driving motor (150); and wherein the reference current value is set to a value within a range of 0.5 to 0.7 times the maximum driving current value of the motor driving unit (130).

2. The method of claim 1, wherein operation (S2) of determining the jam occurrence situation further comprises:

operation (S2*b*) of starting to drive the cutter driving motor (150) in a forward direction when recognizing the output command (S2*a*);

detecting a driving current applied to the cutter driving motor (150) through the current sensing unit (140), and then determining whether the driving current exceeds a preset reference current value (S2*c*);

if the drive current is determined to exceed the reference current value, operating a brake on the drive of the cutter driving motor (150) (S2*d*), and then operation (S2*e*) of driving the cutter driving motor (150) in a reverse direction until a cutter position sensor (160) senses a current return; and operation of (S2*f*) of transmitting a jam occurrence situation signal.

3. The method of claim 1, wherein the checking whether or not the jam occurrence situation is restored (S5) is performed through at least one of continuously detecting opening and closing of a printer paper cover and checking whether a printer paper is abnormal through a printer paper detection sensor.

* * * * *